(12) United States Patent
Chiang et al.

(10) Patent No.: US 8,570,792 B2
(45) Date of Patent: Oct. 29, 2013

(54) MAGNETORESISTIVE RANDOM ACCESS MEMORY

(75) Inventors: Tien-Wei Chiang, Taipei (TW); Kai-Chun Lin, Hsinchu (TW); Ya-Chen Kao, Fuxing Township, Taoyuan County (TW); Hung-Chang Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 7 days.

(21) Appl. No.: 13/356,920

(22) Filed: Jan. 24, 2012

(65) Prior Publication Data

US 2013/0188418 A1    Jul. 25, 2013

(51) Int. Cl.
*G11C 11/00* (2006.01)
*G11C 11/14* (2006.01)

(52) U.S. Cl.
USPC .......................................... 365/158; 365/171

(58) Field of Classification Search
USPC .......................................................... 365/158
See application file for complete search history.

(56) References Cited

U.S. PATENT DOCUMENTS

| | | | | |
|---|---|---|---|---|
| 6,603,677 B2* | 8/2003 | Redon et al. | | 365/158 |
| 6,950,335 B2* | 9/2005 | Dieny et al. | | 365/171 |
| 7,020,009 B2 | 3/2006 | Ho et al. | | |
| 7,515,458 B2 | 4/2009 | Hung et al. | | |
| 7,796,428 B2* | 9/2010 | Redon | | 365/171 |
| 8,169,816 B2* | 5/2012 | Min et al. | | 365/158 |
| 2004/0108561 A1 | 6/2004 | Jeong | | |
| 2010/0044667 A1 | 2/2010 | Park et al. | | |
| 2011/0164448 A1 | 7/2011 | Sato et al. | | |
| 2012/0002330 A1 | 1/2012 | Matsuzawa et al. | | |
| 2013/0015538 A1* | 1/2013 | Liu et al. | | 257/421 |

FOREIGN PATENT DOCUMENTS

| | | |
|---|---|---|
| JP | 2004-311942 | 11/2004 |
| JP | 2005-116888 | 4/2005 |

OTHER PUBLICATIONS

Li, H. et al., "Thermal-Assisted Spin Transfer Torque Memory (STT-RAM) Cell Design Exploration", IEEE Computer Society Annual Symposium on VLSI, 2009, pp. 217-222.
Law, R. et al., "Reduction in critical current for spin transfer switching in perpendicular anisotropy spin valves using an in-plane spin polarizer", Applied Physics Letters, 2009, 94:062516-1-062516-3.
Liu, L. et al., "Reduction of the spin-torque critical current by partially canceling the free layer demagnetization field", Applied Physics Letters, 2009, 94:122508-1-122508-3.
Li, H. et al., "Thermal-Assisted Spin Transfer Torque Memory (STT-RAM) Cell Design Exploration", IEEE Computer Society Annual Symposium on VLSI, May 2009, pp. 17-222.
Notice of Co-Pending U.S. Appl. No. 13/183,968, filed Jul. 15, 2011.
Official Action issued Jul. 18, 2013, in counterpart Korean Patent Application No. 10-2012-0067948.
Yamahata, S. et al, "InP/InGaAs Collector-Up Heterojunction Bipolar Transistors Fabricated Using Fe-Ion-Implantation", Seventh International Conference on Indium Phosphide and Related Materials, May 1995, pp. 652-655.

* cited by examiner

*Primary Examiner* — Son Mai
(74) *Attorney, Agent, or Firm* — Duane Morris LLP

(57) ABSTRACT

A magnetoresistive random access memory (MRAM) cell includes a magnetic tunnel junction (MTJ), a top electrode disposed over the MTJ, a bottom electrode disposed below the MTJ, and an induction line disposed above or below the MTJ. The induction line is configured to induce a magnetic field at the MTJ.

18 Claims, 9 Drawing Sheets

MAGNETORESISTIVE RANDOM ACCESS MEMORY

TECHNICAL FIELD

The present disclosure relates generally to an integrated circuit, and more particularly, a Magnetoresistive Random Access Memory (MRAM).

BACKGROUND OF THE INVENTION

A Magnetoresistive Random Access Memory (MRAM) stores data in magnetic storage, e.g., magnetic tunnel junctions (MTJs). The reading of the MRAM is accomplished by measuring the electrical resistance of the MRAM cell, which changes according to the magnetic field polarities of the MTJ in the MRAM cell. Data is written to the MRAM cells by storing a magnetic field polarity in the MTJ by using an electrical current (a threshold/critical current). The threshold current affects the power consumption of the MRAM.

BRIEF DESCRIPTION OF THE DRAWINGS

The accompanying drawings illustrate embodiments of the invention, as well as other information pertinent to the disclosure, in which.

DETAILED DESCRIPTION

Figure 1:
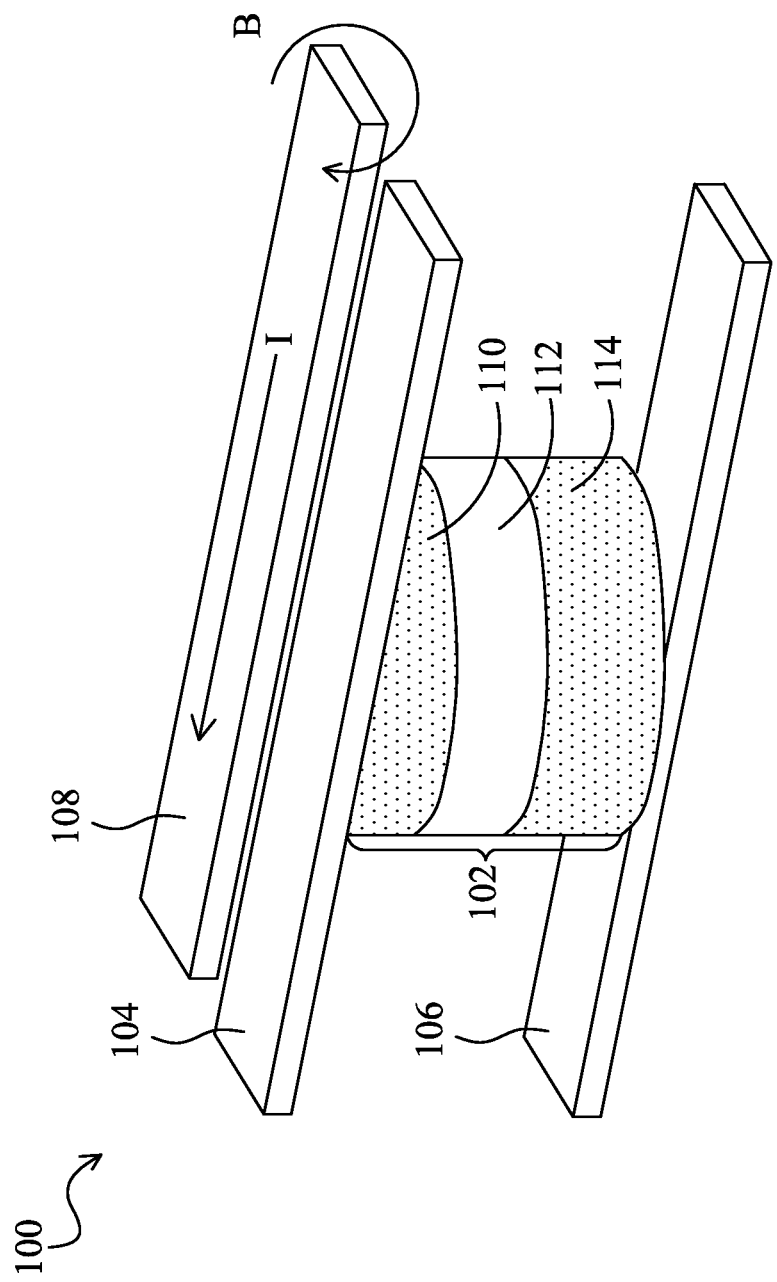
FIGS. 1 to 1C are perspective views of exemplary MRAM cells according to some embodiments.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another, or communicate with one another, either directly or indirectly through intervening structures, as well as both movable or rigid attachments or relationships, unless expressly described otherwise. Terms concerning electrical coupling and the like, such as "coupled", "connected" and "interconnected," refer to a relationship wherein elements communicate with one another either directly or indirectly through intervening elements unless expressly described otherwise.

FIG. 1 is a perspective view of an exemplary MRAM cell according to some embodiments. The MRAM cell 100 has an MTJ 102, a top electrode 104, a bottom electrode 106, and a (magnetic field) induction line 108. The MTJ 102 comprises a free layer 110, an insulator (spacer, or tunnel barrier) 112, and a fixed layer 114. The induction line 108 is located to one side of the MTJ 102. The MRAM cell 100, memory arrays including the same, and methods of making the same are fully described in co-pending and commonly assigned U.S. patent application Ser. No. 13/183,968 entitled "Magnetoresistive Random Access Memory and Method of Making the Same", filed on Jul. 15, 2011, the entirety of which is hereby incorporated by reference herein.

The free layer 110 and the fixed layer 114 form two ferromagnetic plates, each of which can hold a magnetic field, separated by a thin insulator 112. The fixed layer 114 has a fixed magnetic polarity, and the free layer 110 has a changeable magnetic polarity to match an external field to store data. Due to a magnetic tunnel effect, the electrical resistance of the MTJ 102 changes based on the orientation of the magnetic fields in the two plates, i.e., the free layer 110 and the fixed layer 114. The MTJ 102 has lower resistance if the two plates have the same polarity and higher resistance if the two plates are of opposite polarity in some embodiments.

The MTJ 102 can be manufactured with thin film technology, such as magnetron sputter deposition, molecular beam epitaxy, pulsed laser deposition, electron beam physical vapor deposition, or any other suitable methods. The MTJ 102 is shown to have an oval or elliptical shape, and has different shapes in other embodiments.

The free layer 110 comprises magnetic material, e.g., CoFeB, NiFe, with a thickness of about 15-25 angstroms (Å), while the fixed layer 114 comprises magnetic material, e.g., CoFe, CoFeB, with a thickness of about 40-60 Å (thicker than the free layer 110) in some embodiments. The insulator 112 comprises MgO, $Al_2O_3$, or any other suitable material.

The top electrode 104, the bottom electrode 106, and the induction line 108 can comprise electrically conductive material, such as copper, copper alloy, aluminum, aluminum/silicon/copper alloy, titanium, titanium nitride, tantalum, tantalum nitride, tungsten, polysilicon, metal silicide, any combinations thereof, or any other suitable materials. The top electrode 104, the bottom electrode 106, and the induction line 108 are formed by a process including physical vapor deposition (PVD such as PVD by sputtering), chemical vapor deposition (CVD), plating, damascene processes, combinations thereof, or any other suitable processes. The induction line 108 can be also formed from the same layer as the MTJ 102 in some embodiments.

The MRAM cell 100 shows the direction of a current I on the induction line 108 and the induced magnetic field B from the induction line 108 by the current I. The induced magnetic field B is perpendicular with respect to the magnetic field of the MTJ 102 (i.e., the induced magnetic field is in the Z-direction assuming, for example, the top/bottom surfaces of the MTJ lie in the X-Y plane). The induced perpendicular magnetic field contributes to decrease the threshold (switching) current for writing of the MRAM cell 100, thus reducing power consumption.

Compared to a thermal assisted (TA) or Joule heating writing method, the MRAM cell 100 does not require a long heating time that is needed for those methods. Also, compared to a writing method using a perpendicular magnetic layer structure, the MRAM cell 100 is more economical.

In the embodiment in FIG. 1, the induction line 108 is positioned beside the top electrode 104, but the induction line 108 can be located in other places, in order to induce a perpendicular magnetic field at the MTJ 102, e.g., above or beside the bottom electrode 106 to one side of the MTJ 102, or above the top electrode 104 to one side of the MTJ 102, etc. Also, the induction line 108 can be formed using the same layer as any of the top electrode 104, the MTJ 102, the bottom electrode 106, or in any other electrically conductive layer that can induce a perpendicular magnetic field at the MTJ 102.

In some embodiments, the MRAM cell is a spin transfer torque (STT) MRAM cell.

Figure 1A:
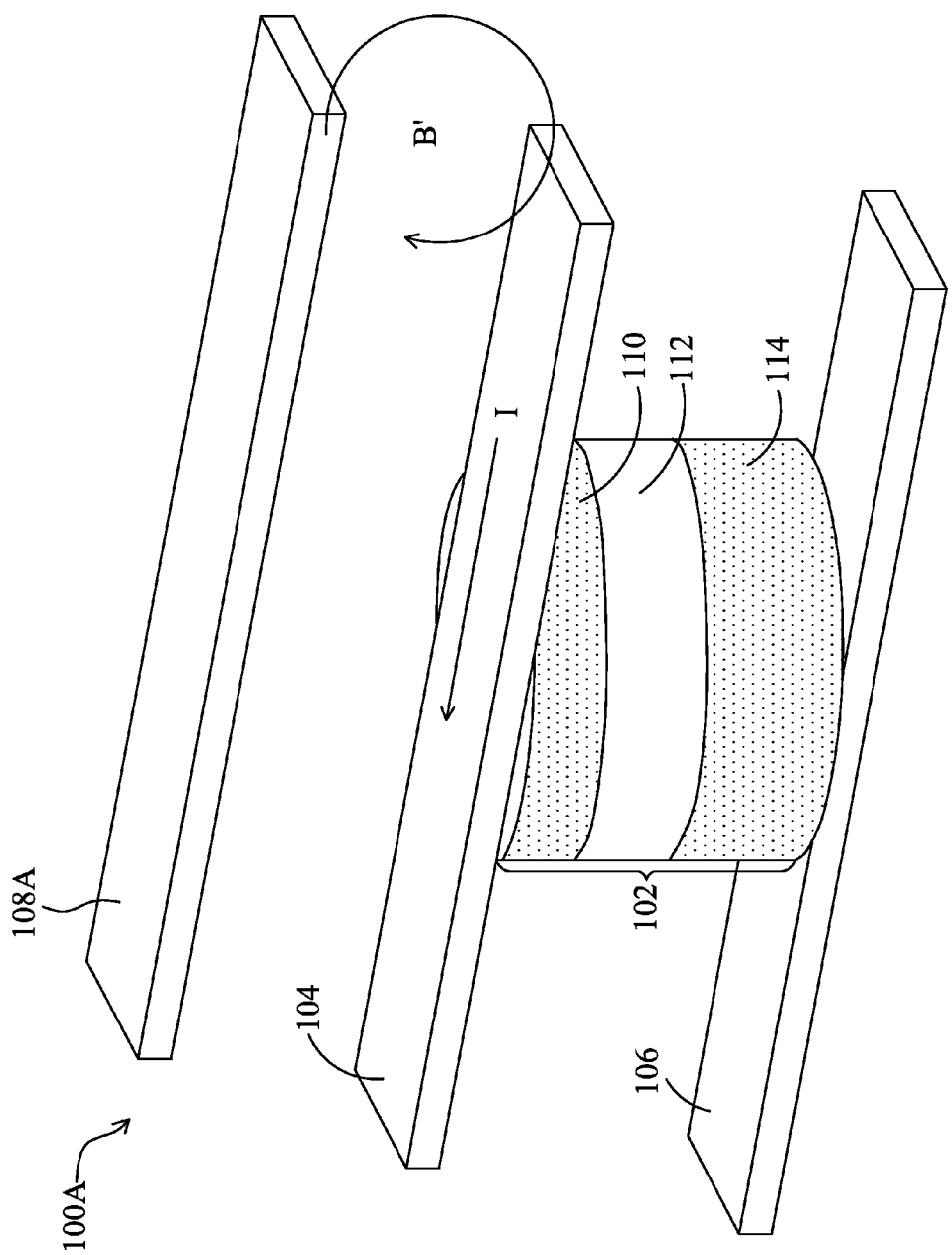

FIG. 1A illustrates an alternative MRAM cell 100A. MRAM cell 100A is identical to MRAM cell 100 only the induction line 108A is disposed above (i.e., at a higher level) than the MTJ 102. In embodiments, the induction line 108A is formed in a different metal layer than the top electrode 104. Specifically, in the illustrated embodiment, the induction line 108A is disposed above and to the side of the MTJ 102 (i.e., there is no overlap with the MTJ). It may be difficult from a layout perspective to locate the induction line immediately adjacent to the top (or bottom) electrode or the MTJ. In order to induce the desired magnetic field with respect to the magnetic field of the MTJ 102, the current through the induction line 108A can be adjusted to provide the desired magnetic moment of the induced field at the MTJ 102. In an alternative embodiment, the induction line is similarly located but below the MTJ rather than above.

Assuming an elliptical shape for the MTJ 102, which defines short (X) and long (Y) axes, then the MTJ magnetic field will be in the direction of the long (Y) axis. The long (Y) axis is also referred to as the "easy" axis since this axis of the junction is the easiest to magnetize. The location of the top electrode is not important, as only the location of the induction line determines the direction of the induced magnetic field. The induced magnetic field B' is in the long (Y) axis (i.e., parallel to the field of the MTJ (or parallel to the easy axis of the MTJ)) when the induction line 108A is oriented parallel to the short (X) axis of the MTJ 102, and in the short (X) axis when the induction line 108A is oriented parallel to the long (Y) axis of the MTJ 102. Orienting the magnetic field either parallel or perpendicular to the field MTJ 102 contributes to decrease the threshold (switching) current for writing of the MRAM cell 100, thus reducing power consumption.

The induced magnetic field is perpendicular when in the X or Z direction. When the induced field is perpendicular, magnetization switching can be greatly accelerated and the switching current density reduced. The induced magnetic field is parallel when in the Y direction. This induced magnetic field gives the MTJ some magnetic energy and reduces the switching current density.

Figure 2:
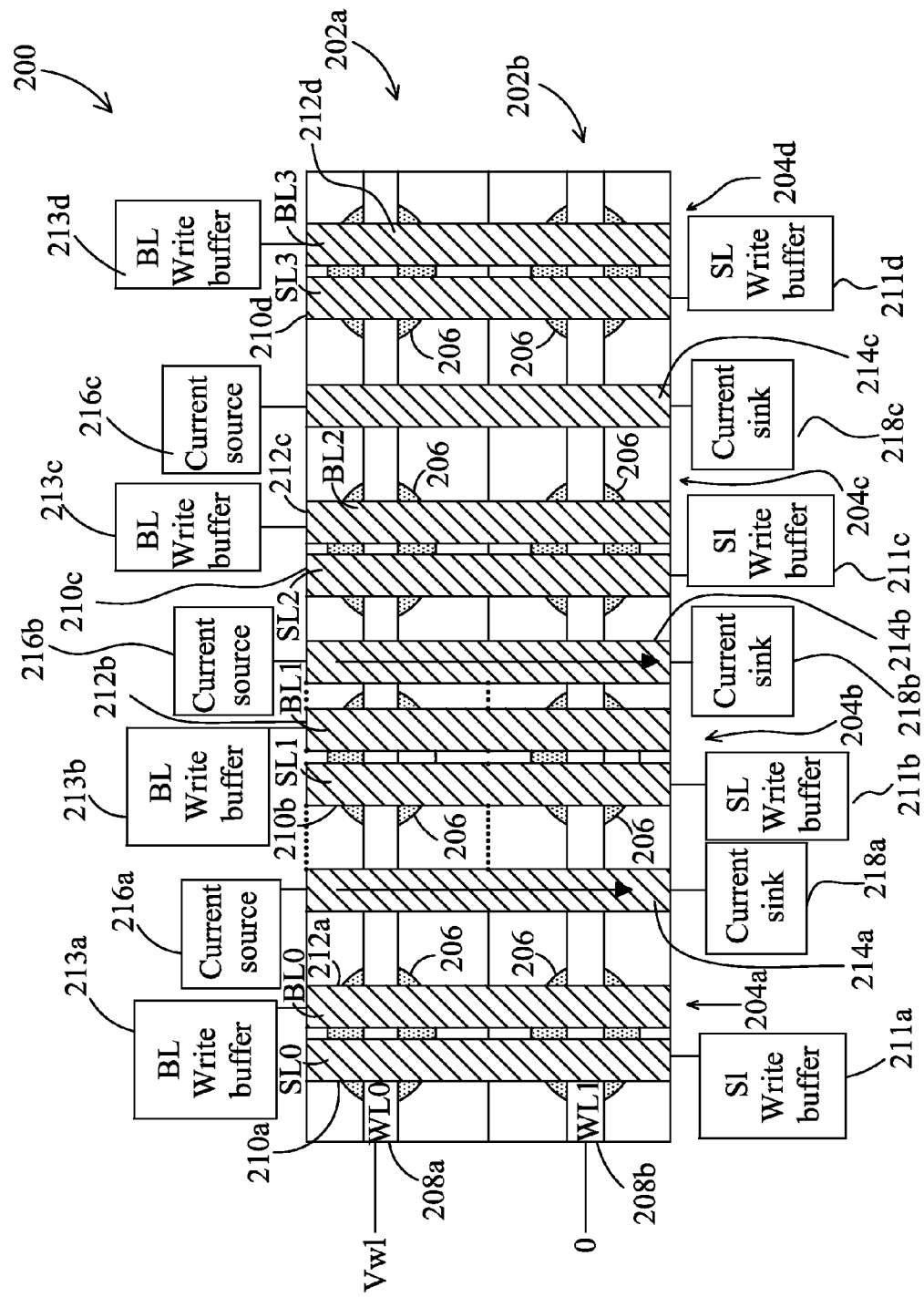
FIGS. 2 to 2D are schematic illustrations of exemplary MRAM cell array write circuits according to some embodiments

FIG. 2 is a schematic illustration of an embodiment of a write circuit 200 for a MRAM cell array including MRAM cells as described above in connection with, for example, FIGS. 1 and 1A. It should be understood that while the array is shown as including only two rows 202 and four columns 204 of MRAM cells, this is for illustration purposes only. The 2×4 array includes eight MTJs 206. The first row 202a of MTJs is associated with a first word line (WL0) 208a, and the second row 204a of MTJs is associated with a second word line (WL1) 208b. Each column 204 of MRAM cells is associated with a respective source line 210, source line write buffer 211, bit line 212, which may correspond to the top electrode of the MRAM cell, and bit line write buffer 213. Each column of MRAM cells is also associated with a respective induction line 214 coupled to a respective current source 216 and current sink 218. The top electrode of the MRAM cell connects with the source line, and the bottom electrode of the MRAM cell connects with the bit line, or vice versa.

For purposes of illustrating the operation of the write circuit, assume that the MRAM cell corresponding to the first row 208a and second column 204b is selected for write operation. This MRAM cell is illustrated in dashed line. In order to decrease the threshold (switching) current for writing of this MRAM cell, and thus reducing power consumption, current is provided to the induction line 214b associated with the MRAM cells of the column 204b. Particularly in instances where the induction line 214b is not, or cannot, be located immediately adjacent to the MTJ 206, such as shown above in FIG. 1A, then the induction line 214 from an adjacent column of cells on the other side of the MTJs 206 can also be provided current to induce a magnetic field at selected MTJ 206. In this example, current is provided also to induction line 214a as shown by the current line in both induction lines 214A and 214B. With both induction lines contributing the desired magnetic field perpendicular to the magnetic field of the selected MTJ 206, a desired decrease in the threshold (switching) current for writing to the selected MRAM cell can be achieved.

Figure 2A:
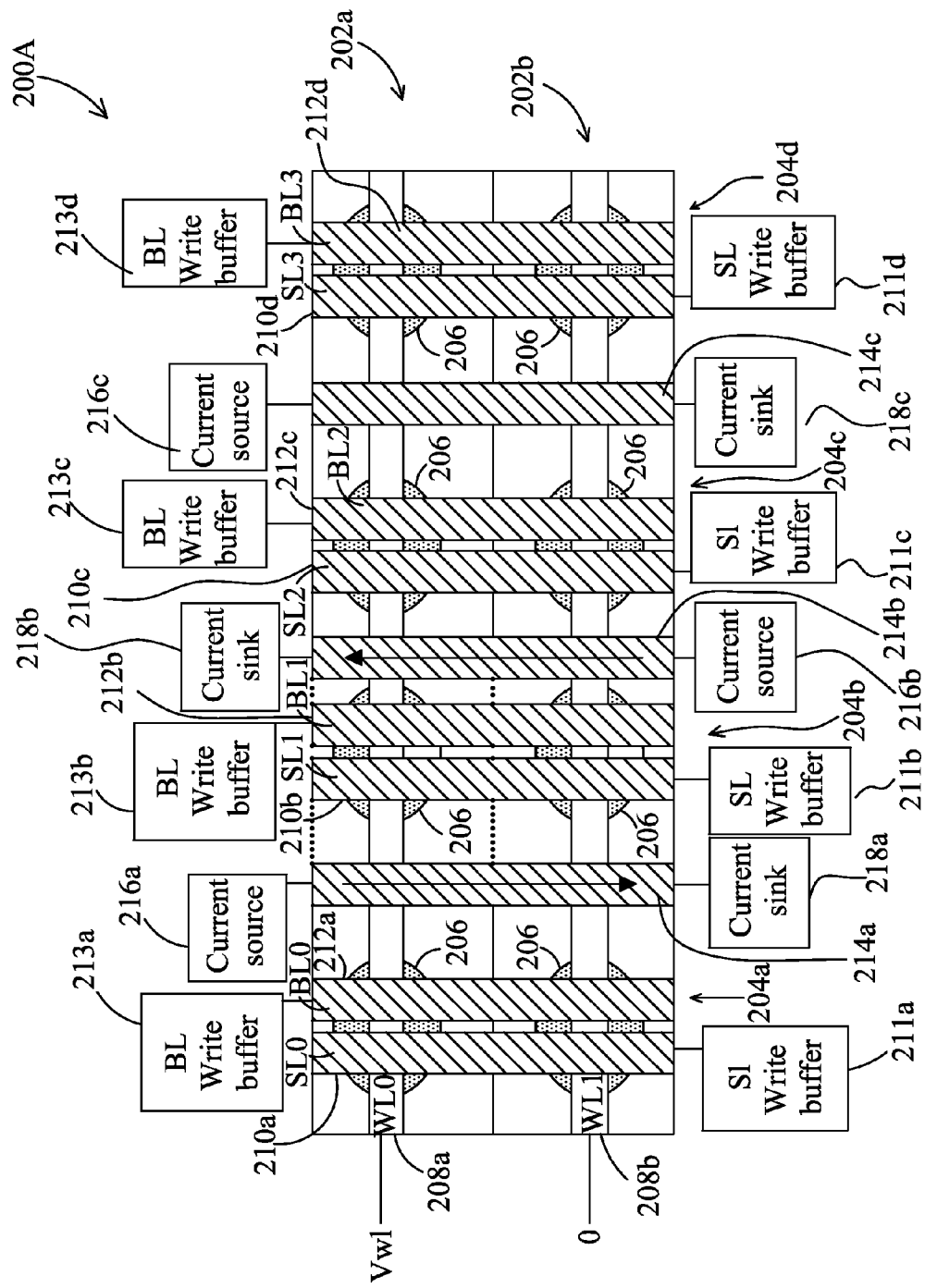

FIG. 2A is a schematic illustration of another embodiment of a write circuit 200A for a MRAM cell array including MRAM cells as described above in connection with, for example, FIGS. 1 and 1A. The write circuit of FIG. 2A is identical to the write circuit of FIG. 2 except in one regard—the current in the induction line 214b flows in the opposite direction to the current in the other activated induction line 214a. The actual directions of the currents—whether in the same or opposite directions—does not affect the moment of the magnetic field at the selected MTJ 206.

Figure 2B:
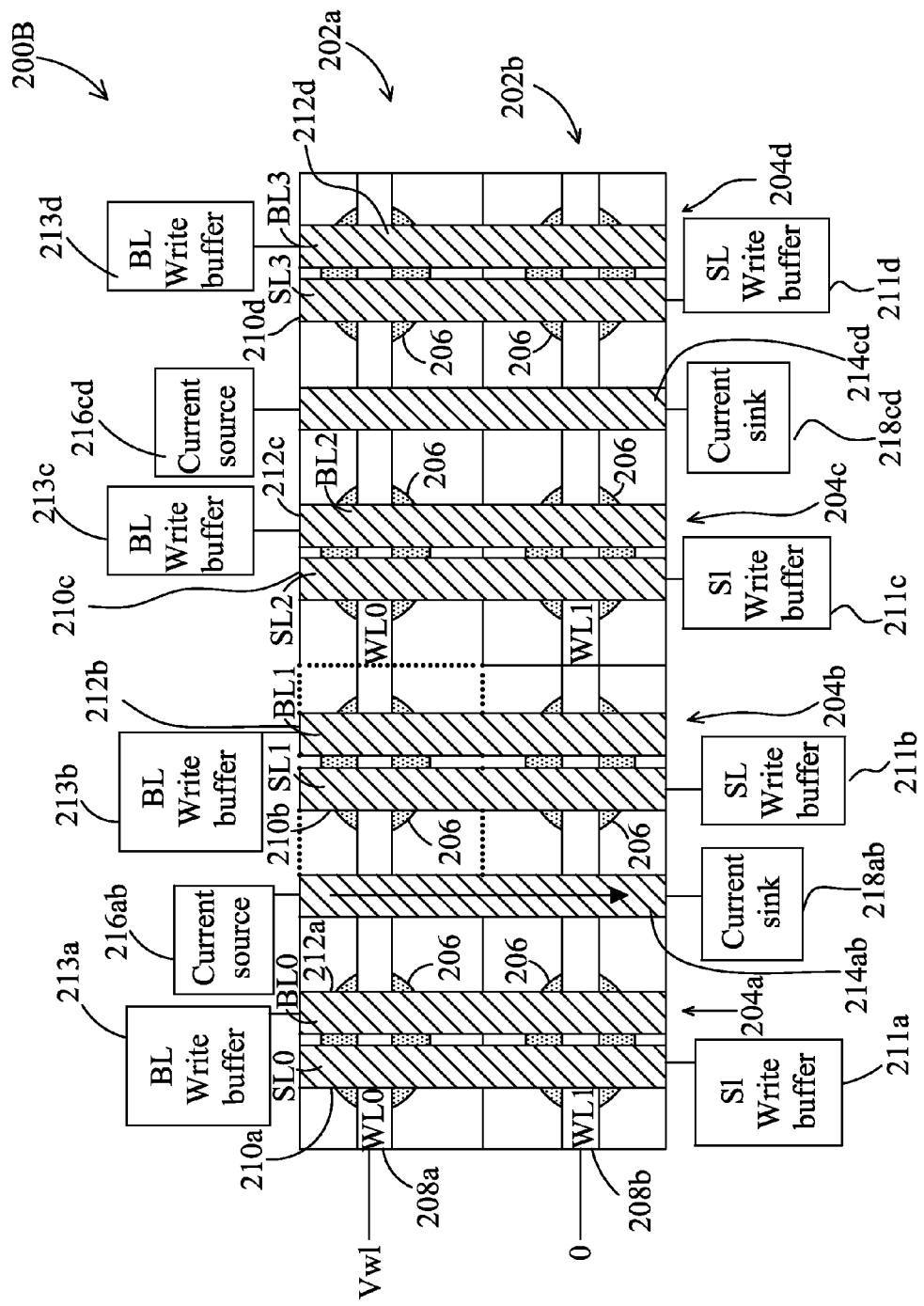

FIG. 2B is a schematic illustration of another embodiment of a write circuit 200B for a MRAM cell array including MRAM cells as described above in connection with, for example, FIGS. 1 and 1A. The write circuit of FIG. 2B is identical to the write circuit of FIG. 2 except that two columns of MRAM cells share only one induction line 214. For example, induction line 214ab serves both columns 204a and 204b, and induction line 214cd serves both columns 204c and 204d. When a MRAM cell from either column 204a or 204b is selected for write operation, then current is provided to induction line 214ab. Likewise, when a MRAM cell from either column 204c or 204d is selected for write operation, then current is provided to induction line 214cd.

Figure 1B:
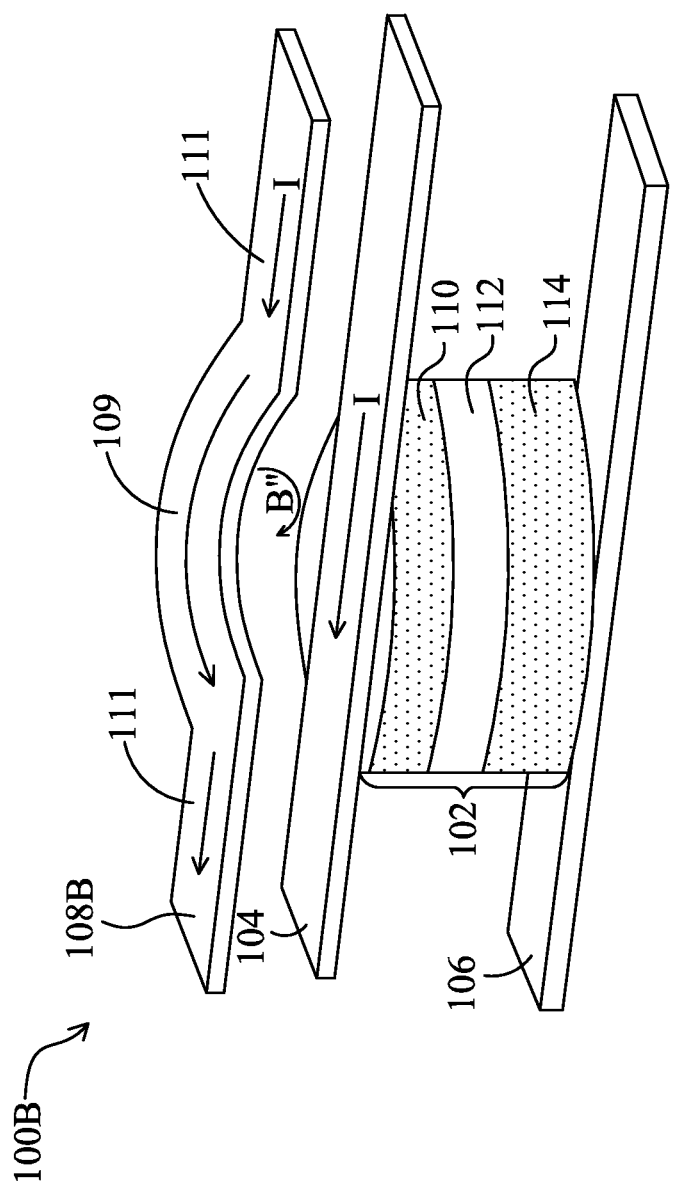
Figure 2C:
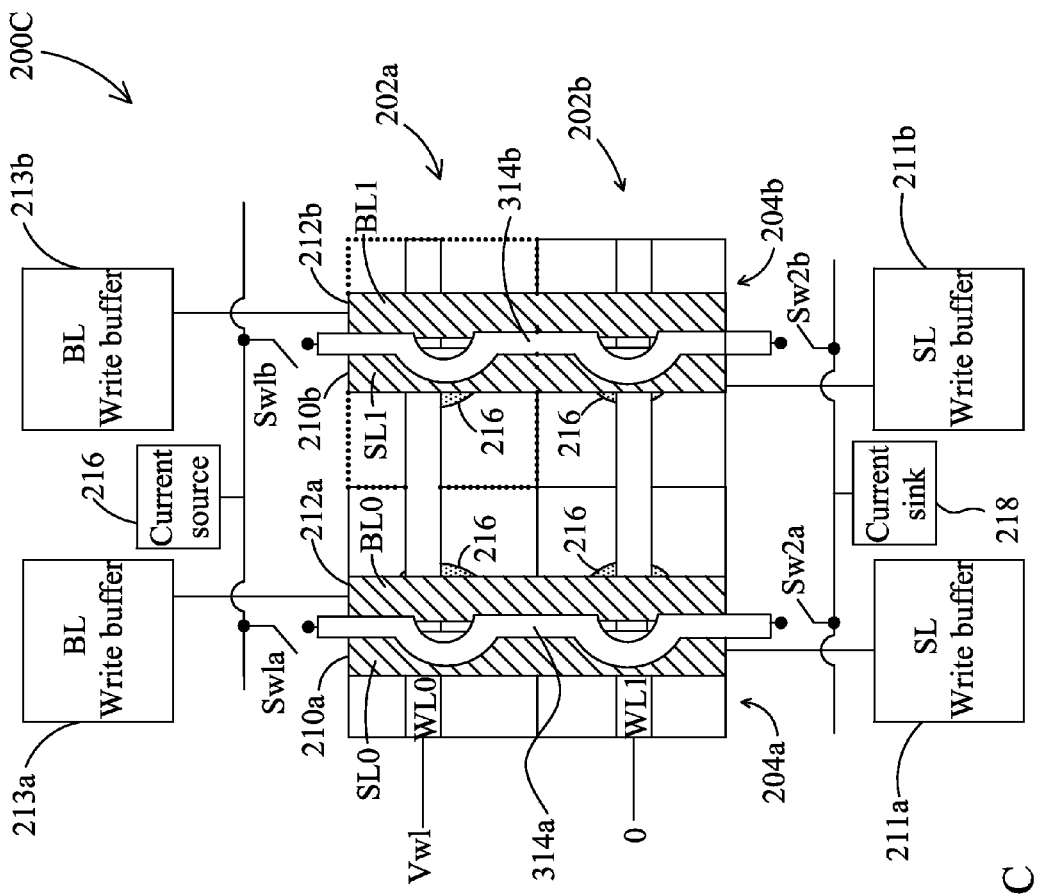

FIG. 2C is a schematic illustration of another embodiment of a write circuit 200C for a MRAM cell array including MRAM cells. The write circuit is identical to the write circuit of FIG. 2 except in three regards. First, the array is illustrates as a 2×2 array of MRAM cells rather than a 2×4 array. This is merely for illustrative purposes. Second, the induction lines, labeled with reference 314 in the figure, overly the MTJs 216. That is, the induction lines 314 are disposed over, i.e., above and partially cover, the MTJ. These induction lines 314 are described in more detail with respect to FIG. 1B discussed below. Third, one current source/current sink pair 216, 218 provides current for multiple induction lines 314 via selectable switches SW1 and SW2. For example, if the dashed-in MRAM cell is selected (e.g., the MRAM cell at row 1, column 2), then switches SW1b and SW2b are triggered to connect induction line 314b to current source 216 and current sink 218, respectively. This embodiment saves layout area when compared to embodiments where each induction line has its own current source/current sink pair.

Referring now to FIG. 1B, the MRAM cell 100B is identical to the MRAM cell 100 of FIG. 1 except for the shape and position of the induction line 108B. In the illustrated embodiment, the induction line 108B is positioned over the MTJ 102 such that is fully or partially overlaps or covers the top surface of the MTJ 102. The induction line 108B may be formed in a different metal layer than the top electrode 104. The induction line 108B could also be positioned underneath the MTJ 102 in a similar fashion. Of particular note, the induction line 108B also includes an arched portion 109 positioned between otherwise substantially regular shaped, straight portions 111. The portion 109 arches in plane with the straight portions 111 but in a general direction perpendicular to either the long or short axis of the MTJ. Assuming the straight portions 111 are aligned with the long (Y) axis of the MTJ 102, then the portion 109 arches out in the X direction, and assuming the straight portions 111 extend along the short (X) axis of the MTJ 102, then the portion 109 arches out in the Y direction. To the extent the inducting line 108B overlies multiple MTJs 102 in a single column, it can include multiple arched portions 109, with a respective arched portion 109 overlying each MTJ 102. It has been found that using these arched portions 100 can induce significantly more magnetic moment perpendicular to the magnetic field of the MTJ 102 when compared to a straight induction line given the same current. It should be understood that different shapes can provide different intensities for the perpendicular magnetic field. For example, a circle would provide the largest intensity and is an example of another embodiment.

Assuming again an elliptical shape for the MTJ 102, which defines a short (X) and long (Y) axes, then the induced perpendicular magnetic field B" is in the Z-direction, regardless of whether the top electrode line 104 is oriented along the long (Y) axis or short (X) axis.

Figure 1C:
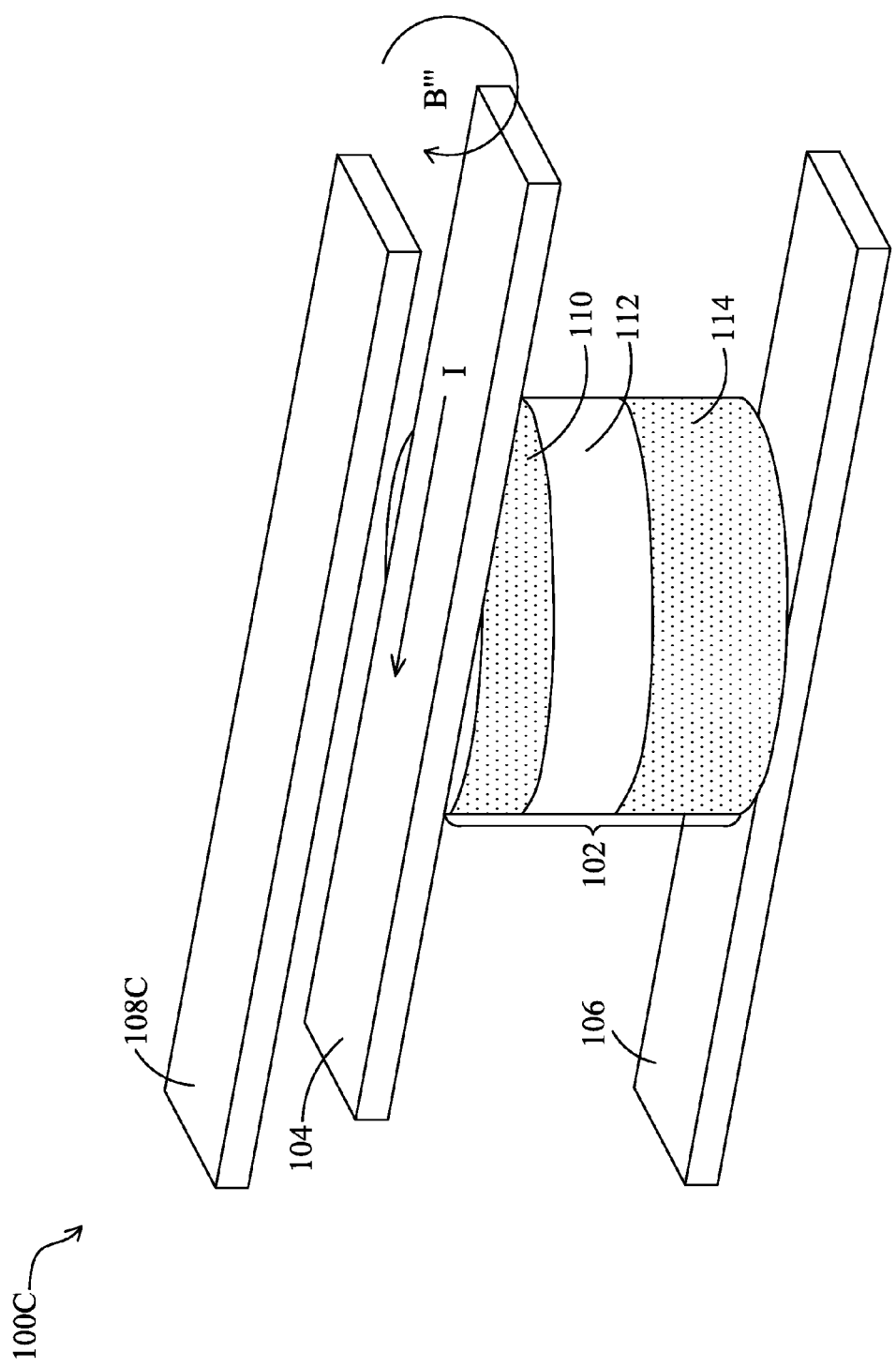
Figure 2D:
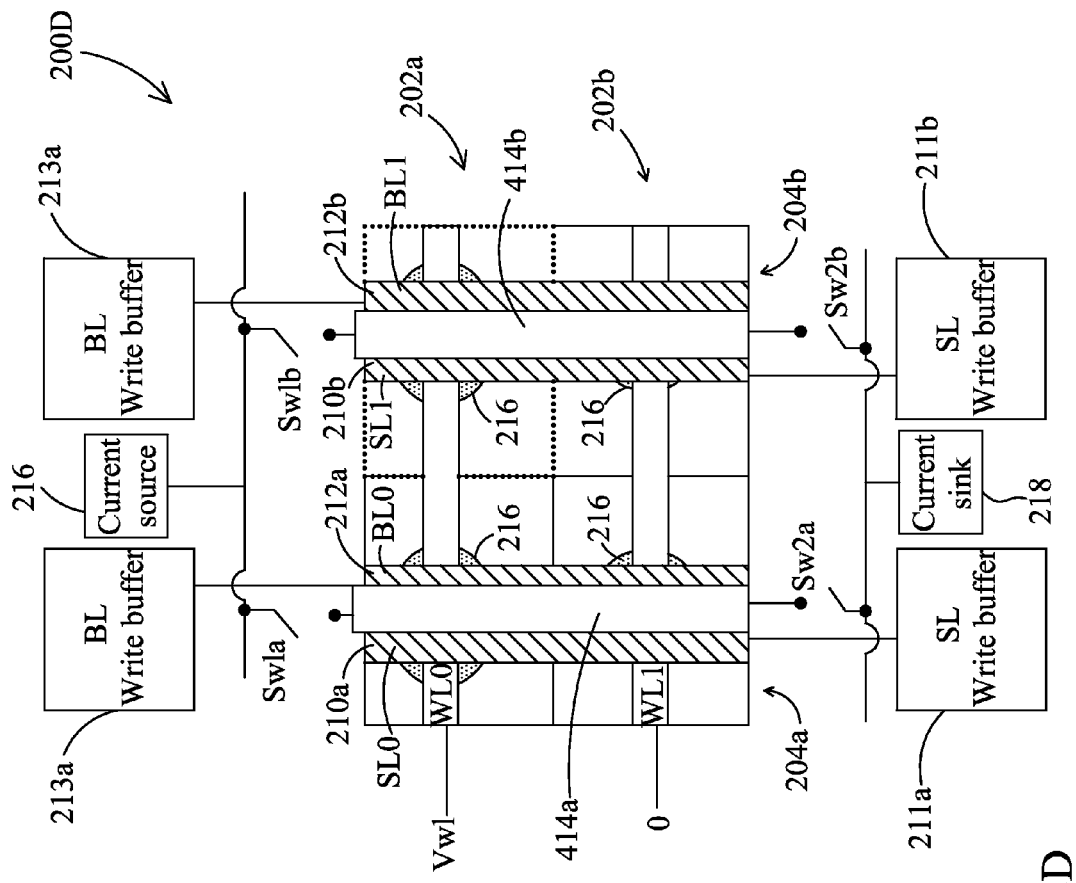

FIG. 1C illustrates another embodiment of a MRAM cell 100C where the induction line 108C overlies the MTJ 102, only in comparison to the induction line 108B of FIG. 1B the induction line 100C has a substantially continuous, regular shape without arched portions overlying the MTJ 102. The induction line 108C may be formed in a different metal layer than the top electrode 104. A write circuit 200D for an array of MRAM cells of the type illustrated in FIG. 1C is shown in FIG. 2D. The write circuit 200D is identical to the write circuit 200C of FIG. 1C except for the shape of the induction lines 414 overlying the MTJs 216.

Assuming again an elliptical shape for the MTJ 102, which defines a short (X) and long (Y) axes, then the induced perpendicular magnetic field B''' is in the long (Y) axis (i.e., parallel to the magnetic field of the MTJ 102) when the top electrode line 104 and overlying induction line 108C are parallel to the short (X) axis of the MTJ 102, and in the short (X) axis (i.e., perpendicular to the magnetic field of the MTJ 102) when the top electrode line 104 and overlying induction line 108C are parallel to the long (Y) axis of the MTJ 102

It should be understood that as with the embodiments where at least two induction lines above and/or to the side of the MTJ are used to induce a magnetic field at the MTJ, induction lines may also be placed both over and under the MTJ to induce a magnetic field at the MTJ. Likewise, combinations are also contemplated, e.g., combinations of induction lines over, under, above, below and/or at sides of the MTJ.

In some embodiments, a magnetoresistive random access memory (MRAM) cell includes a magnetic tunnel junction (MTJ), a top electrode disposed over the MTJ, a bottom electrode disposed below the MTJ, and an induction line disposed above or below the MTJ. The induction line is configured to induce a magnetic field at the MTJ.

In other embodiments, the MRAM cell includes a magnetic tunnel junction (MTJ) having an oval or elliptical shape having short (X) and long (Y) axes, a top electrode disposed over the MTJ, a bottom electrode disposed below the MTJ, an induction line disposed above or below the MTJ, wherein the induction line is configured to induce a magnetic field at the MTJ.

In some embodiments of an MRAM cell array write circuit, the write circuit includes: a plurality of MRAM cells arranged in an array of rows and columns, each MRAM cell comprising a magnetic tunnel junction (MTJ), a top electrode disposed over the MTJ, a bottom electrode disposed below the MTJ; at least one induction line disposed with respect to each of two columns of MRAM cells, each induction line configured to induce a magnetic field at the MTJs with respect to which it is disposed; and at least one current source for providing current to the at least one induction line.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A magnetoresistive random access memory (MRAM) cell, comprising:
   a magnetic tunnel junction (MTJ);
   a top electrode disposed over the MTJ;
   a bottom electrode disposed below the MTJ; and
   an induction line disposed above or below the MTJ,
   wherein the induction line is configured to induce a magnetic field at the MTJ, and
   wherein the induction line includes an arch shaped portion for inducing the magnetic field at the MTJ.

2. The MRAM cell of claim 1, wherein the induction line is disposed directly over or underneath the MTJ.

3. The MRAM cell of claim 1, wherein the induction line is disposed to one side of the MTJ.

4. The MRAM cell of claim 1, further comprising a second induction line configured to induce a magnetic field at the MTJ.

5. The MRAM cell of claim 1, wherein the induction line is formed in a different layer than the top electrode, if disposed above the MTJ and in a different layer than the bottom electrode, if disposed below the MTJ.

6. The MRAM cell of claim 1, wherein the MTJ comprises a free layer, a fixed layer, and an insulator disposed between the free layer and the fixed layer, the fixed layer having a fixed magnetic polarity, and the free layer has a changeable magnetic polarity.

7. The MRAM cell of claim 1, wherein the MTJ has an oval or elliptical shape.

8. The MRAM cell of claim 1, wherein the MRAM cell is a spin transfer torque (STT) MRAM cell.

9. A magnetoresistive random access memory MRAM cell array write circuit comprising:
   a plurality of MRAM cells arranged in an array of rows and columns, each MRAM cell comprising a magnetic tunnel junction (MTJ), a top electrode disposed over the MTJ, a bottom electrode disposed below the MTJ;
   at least one induction line disposed with respect to each of two columns of MRAM cells, each induction line configured to induce a magnetic field at the MTJs with respect to which it is disposed; and
   at least one current source for providing current to the at least one induction line,
   wherein the at least one induction line includes only one induction line per two columns of MRAM cells, each column of MRAM cells having only one induction line disposed in connection with it.

10. The MRAM cell array write circuit of claim 9, the at least one current sources comprises a current source for providing current to a plurality of induction lines and a plurality of switches for selectively coupling the current source to the plurality of induction lines.

11. The MRAM cell array circuit of claim 9, wherein the at least one current source comprises a plurality of current sources coupled to a plurality of corresponding induction lines.

12. A magnetoresistive random access memory (MRAM) cell, comprising:

a magnetic tunnel junction (MTJ) having an oval or elliptical shape having short (X) and long (Y) axes;
a top electrode disposed over the MTJ;
a bottom electrode disposed below the MTJ; and
an induction line disposed above or below the MTJ,
wherein the induction line includes an arch shaped portion configured to induce a magnetic field at the MTJ.

13. The MRAM cell of claim 12, wherein the arched shaped portion is disposed between a pair of straight portions of the induction line disposed in line with one another, the straight portions being oriented generally parallel to the long (Y) axis of the MTJ.

14. The MRAM cell of claim 12, wherein the arched shaped portion is disposed between a pair of straight portions of the induction line disposed in line with one another, the straight portions being oriented generally parallel to the short (X) axis of the MTJ.

15. The MRAM cell of claim 12, wherein the arch shaped portion is disposed to induce a magnetic field at the MTJ perpendicular to both the short (X) and long (Y) axes of the MTJ.

16. The MRAM cell of claim 12, wherein at least a portion of the induction line is disposed directly over or underneath the MTJ.

17. The MRAM cell of claim 1, wherein the MTJ has a long axis (Y) and an short axis (X), and the arch shaped portion is oriented to induce a magnetic field at the MTJ perpendicular to both the short (X) and long (Y) axes of the MTJ.

18. A magnetoresistive random access memory (MRAM) cell array write circuit comprising:
a plurality of MRAM cells arranged in an array of rows and columns, each MRAM cell comprising a magnetic tunnel junction (MTJ), a top electrode disposed over the MTJ, a bottom electrode disposed below the MTJ;
at least one induction line disposed with respect to each of two columns of MRAM cells, each induction line configured to induce a magnetic field at the MTJs with respect to which it is disposed; and
at least one current source for providing current to the at least one induction line,
wherein the at least one induction line includes a pair of induction lines disposed at opposite sides of the MTJs of each individual column of MTJs, and
wherein current from the at least one current source flows in the same direction through the pair of induction lines during a write operation.

* * * * *

UNITED STATES PATENT AND TRADEMARK OFFICE
CERTIFICATE OF CORRECTION

Page 1 of 1

PATENT NO.         : 8,570,792 B2
APPLICATION NO.    : 13/356920
DATED              : October 29, 2013
INVENTOR(S)        : Tien-Wei Chiang et al.

It is certified that error appears in the above-identified patent and that said Letters Patent is hereby corrected as shown below:

In the Claims

Claim 9, Column 6, Line 41 – delete the word "MRAM" and insert -- (MRAM) --.

Signed and Sealed this
Thirtieth Day of December, 2014

Michelle K. Lee
*Deputy Director of the United States Patent and Trademark Office*